(12) United States Patent
Shekhawat

(10) Patent No.: US 8,503,146 B1
(45) Date of Patent: Aug. 6, 2013

(54) GATE DRIVER WITH SHORT-CIRCUIT PROTECTION

(75) Inventor: Sampat Shekhawat, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 410 days.

(21) Appl. No.: 12/253,014

(22) Filed: Oct. 16, 2008

Related U.S. Application Data

(60) Provisional application No. 60/999,098, filed on Oct. 16, 2007.

(51) Int. Cl.
*H02H 9/08* (2006.01)

(52) U.S. Cl.
USPC .................................................... 361/93.9

(58) Field of Classification Search
USPC ............................................... 361/93.9
See application file for complete search history.

(56) References Cited

U.S. PATENT DOCUMENTS

| | | | |
|---|---|---|---|
| 5,210,479 A * | 5/1993 | Kimura et al. | 318/727 |
| 5,559,656 A | 9/1996 | Chokhawala | |
| 5,694,282 A * | 12/1997 | Yockey | 361/86 |
| 5,764,466 A | 6/1998 | Mangtani et al. | |
| 6,097,582 A * | 8/2000 | John et al. | 361/79 |
| 6,275,093 B1 | 8/2001 | Shekhawat et al. | |
| 6,717,785 B2 * | 4/2004 | Fukuda et al. | 361/93.1 |
| 7,242,238 B2 * | 7/2007 | Higashi | 327/427 |
| 2004/0252435 A1 * | 12/2004 | Ishikawa et al. | 361/100 |
| 2007/0040542 A1 * | 2/2007 | Cortigiani et al. | 323/312 |
| 2007/0070567 A1 * | 3/2007 | Bayerer et al. | 361/100 |

OTHER PUBLICATIONS

Jun-Bae et al., "Gate Voltage Pattern Analyze for Short-Circuit Protection in IGBT Inverters," APEC, 2007, pp. 1913-1917.
A. Bhalla et al., "IGBT Behavior During Desat Detection and Short Circuit Fault Protection," ISPSD'98, Jun. 3-6, 1998, pp. 245-248.

* cited by examiner

*Primary Examiner* — Scott Bauer
(74) *Attorney, Agent, or Firm* — Sidley Austin LLP

(57) ABSTRACT

According to one embodiment, a power supply system includes a switching device operable to be turned on and off for causing power to be delivered to a load. The switching device has a control terminal. Driver circuitry, coupled to the control terminal of the switching device, is operable to drive the switching device. The driver circuitry further operable to detect a fault condition in the power supply system. If the switching device is turned on when the fault condition is detected, the driver circuitry reduces the voltage at the control terminal of the switching device to a level just above the threshold voltage for the switching device, and holds the voltage at the control terminal to the level just above the threshold voltage for a controlled duration, thereby reducing the saturation current flowing through the switching device. The driver circuitry further reduces the voltage at the control terminal of the switching device after the controlled duration, thereby safely turning off the switching device.

13 Claims, 4 Drawing Sheets

GATE DRIVER WITH SHORT-CIRCUIT PROTECTION

CROSS-REFERENCE TO RELATED APPLICATION AND CLAIM OF PRIORITY

The present application claims the benefit of priority to U.S. Provisional Patent Application Ser. No. 60/999,098, filed Oct. 16, 2007, entitled, "Gate Driver for Short-Circuit Protection in IGBT or MOSFET Inverters," the entirety of which is incorporated by reference herein.

BACKGROUND

1. Field of Invention

The present invention relates to power systems, and more particularly, to a gate driver with short-circuit protection.

2. Description of Related Art

Power converters are essential for many modern electronic devices. Among other capabilities, power converters can adjust voltage level downward (buck converter) or adjust voltage level upward (boost converter). Power converters may also convert from alternating current (AC) power to direct current (DC) power, or vice versa. Power converters are typically implemented using one or more switching devices—such as, for example, metal-oxide-semiconductor field effect transistors (MOSFETs), insulated gate bipolar transistors (IGBTs), insulated gate field effect transistors (IG-FETs), bipolar junction transistors (an's), etc.—which are turned on and off to deliver power to the output of the converter. Control circuitry is provided to regulate the turning on and off of the switching devices, and thus, these converters are known as "switching regulators" or "switching converters." Such a power converter may be incorporated into or used to implement a power supply—i.e., a switching mode power supply (SMPS). The power converters may also include one or more capacitors or inductors for alternately storing and outputting energy.

The main function of any gate driver circuit is to convert a control signal to a power signal that can efficiently control the turn-on and turn-off of the switching device (e.g., IGBT or MOSFET). If the switching device requires short circuit protection, the gate drive circuit must safely turn-off the switching device during a shorted or abnormal overload condition. For example, it is common to use an IGBT for motor drive, uninterruptible power supply (UPS), or other industrial applications of power systems. The IGBT can be destroyed if it is turned-on into a faulted motor, an output short circuit, or an input bus voltage shoot-through. Under these fault conditions, current through the IGBT increases rapidly until it saturates. Because various fault conditions (e.g., short circuit) may occur during operation, fault protection should be employed to prevent the destruction of the IGBT.

There are several known techniques for turning off the IGBT once a fault condition is detected. These include discharging the gate of the IGBT through high gate resistance, abruptly reducing gate voltage to zero, adding source inductance to de-bias the gate, using a sense IGBT which senses fault current with a pilot cell, employing a gate voltage pattern analyzer for short-circuit protection in IGBT inverters, and using a current sense resistor or Hall-effect device to detect fault through the IGBT. None of these techniques are fully satisfactory.

SUMMARY

According to embodiments of the present invention, a gate driver system and method are provided which safely turn off a high trans-conductance switching device (e.g., IGBT or MOSFET) during short-circuit and over-current fault conditions in a power converter. In one embodiment, the gate driver circuit and method provide for two-step, soft turn-off of the switching device.

The gate driver can reduce short circuit switching losses including short circuit current experienced with two-level gate drivers. Further, embodiments of the present invention can eliminate or reduce some of the draw-backs of other three-level gate driver circuits.

According to one embodiment, a power supply system includes a switching device operable to be turned on and off for causing power to be delivered to a load. The switching device has a control terminal. Driver circuitry, coupled to the control terminal of the switching device, is operable to drive the switching device. The driver circuitry further operable to detect a fault condition in the power supply system. If the switching device is turned on when the fault condition is detected, the driver circuitry reduces the voltage at the control terminal of the switching device to a level just above the threshold voltage for the switching device, and holds the voltage at the control terminal to the level just above the threshold voltage for a controlled duration, thereby reducing the saturation current flowing through the switching device. The driver circuitry further reduces the voltage at the control terminal of the switching device after the controlled duration, thereby safely turning off the switching device.

According to another embodiment of the present invention, a system is provided for protecting a switching device in a power supply system, the system includes fault detection circuitry operable to detect a fault condition in the power supply system. If the switching device is turned on when the fault condition is detected, de-saturation circuitry and time constant circuitry are operable to safely turn-off the switching device. The de-saturation circuitry is operable to reduce the voltage at the control terminal of the switching device from a high turn-on voltage level to a low turn-on voltage level, thereby reducing the saturation current in the switching device. The time constant circuitry is operable to control a rate of decrease of the voltage at the control terminal of the switching device from the high turn-on voltage level to the low turn-on voltage.

According to yet another embodiment of the present invention, a method is provided for protecting a switching device in a power supply system. The method includes: detecting a fault condition in the power supply system; if the switching device is turned on when the fault condition is detected, reducing the voltage at a control terminal of the switching device to a level just above the threshold voltage for the switching device; holding the voltage at the control terminal to the level just above the threshold voltage for a controlled duration, thereby reducing the saturation current flowing through the switching device; and further reducing the voltage at the control terminal of the switching device after the controlled duration, thereby safely turning off the switching device.

Important technical advantages of the present invention are readily apparent to one skilled in the art from the following figures, descriptions, and claims.

BRIEF DESCRIPTION OF DRAWINGS

For a more complete understanding of the present invention and for further features and advantages, reference is now made to the following description taken in conjunction with the accompanying drawings.

DETAILED DESCRIPTION

Embodiments of the present invention and their advantages are best understood by referring to FIGS. 1 through 4 of the drawings. Like numerals are used for like and corresponding parts of the various drawings.

Advantages of embodiments of the present invention over previously developed techniques may include reducing switching losses and current stress due to short circuits. Another advantage can be reducing short circuit withstand time (SCWT) to as low as, for example, 2 to 3 μsec. This may allow optimizing IGBT design to reduce losses since longer SCWT (e.g. 10 μsec) is not necessary. Yet another advantage is that some embodiments of the present invention employ a de-saturation protection technology technique, which is better than other techniques for short-circuit protection, such as, a gate voltage pattern analyzer scheme. Still another advantage can be that some embodiments of the present invention do not require high-power shunt resistor for short current detection, as required with previously developed designs. Further, another advantage is that embodiments can be readily and effectively implemented in integrated circuit (IC) devices.

Figure 1:
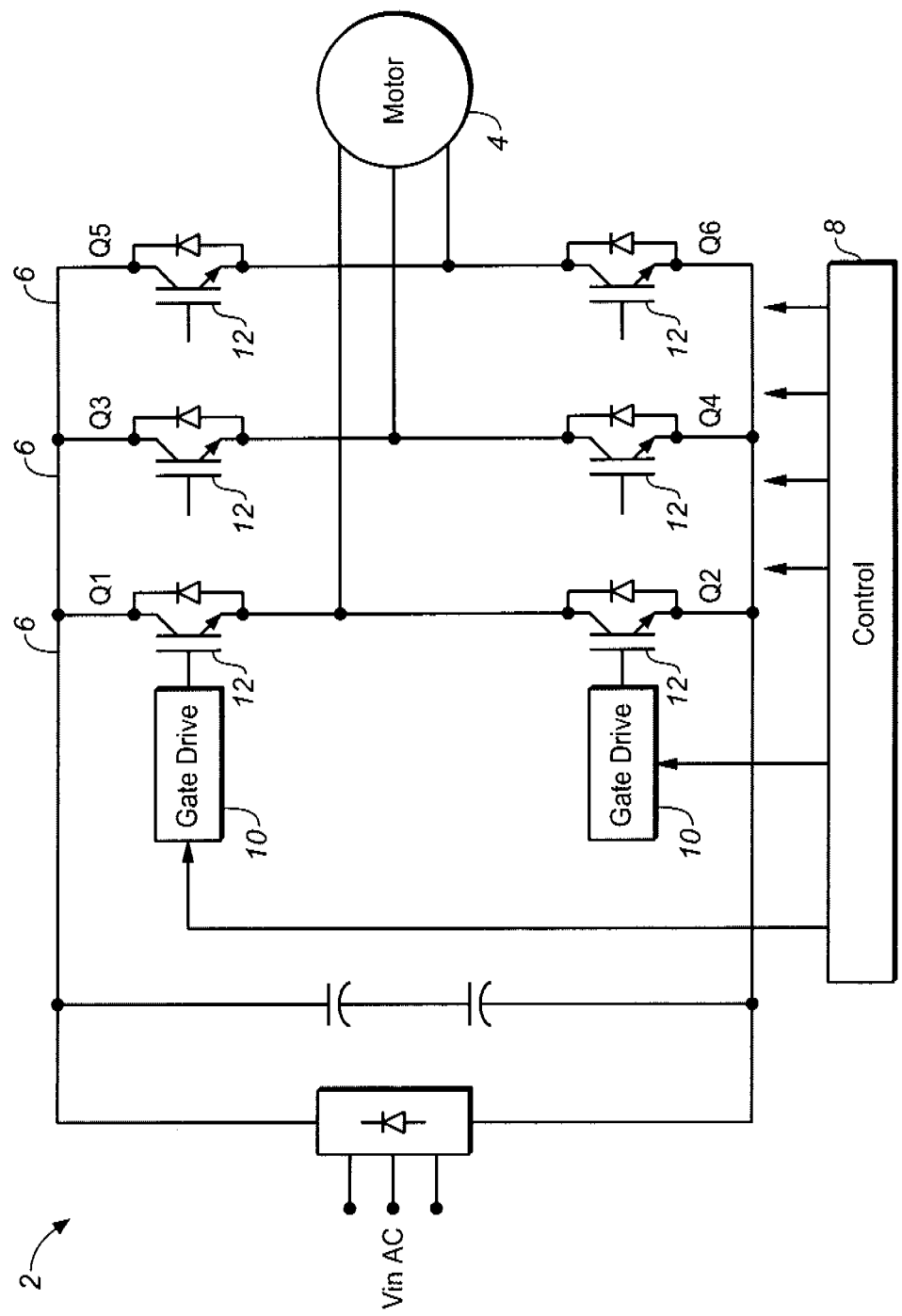
FIG. 1 is a schematic diagram of a power supply system in which a gate driver system, according to an embodiment of the invention, can be used.

FIG. 1 is a schematic diagram of an exemplary power supply system 2 in which a gate driver system, according to an embodiment of the invention, can be used. Power supply system 2 receives AC input voltage and provides power for a motor 4. As shown, power supply system 2 is a three-phase, inverter-driven motor drive supply system. That is, power supply system 2 includes three inverters 6 which are operated in respective phases. Each inverter 6 comprises two switching devices 12 coupled in series. As used herein, the terms "coupled" or "connected," or any variant thereof, covers any coupling or connection, either direct or indirect, between two or more elements. Each switching device 12 can be an insulated gate bipolar transistor (IGBT), a metal-oxide-semiconductor field effect transistor (MOSFET), or bipolar junction transistor (BJT), or other suitable device. A control block 8 provides a separate control signal for each switching device 12. A respective gate driver system 10 converts each control signal to a power signal that can efficiently control the turn-on and turn-off of the relevant switching device 12. The control block 8 can be a suitable controller device, which can be implemented in an integrated circuit (IC). The control block 8 in conjunction with the gate driver systems 10 provide digital control for the switching devices 12. Each gate driver system 10, according to embodiments of the present invention, also provides short-circuit and fault protection for the respective switching device 12 (e.g., IGBT or MOSFET) in power supply system 2.

Figures 2, 2A, 2B:
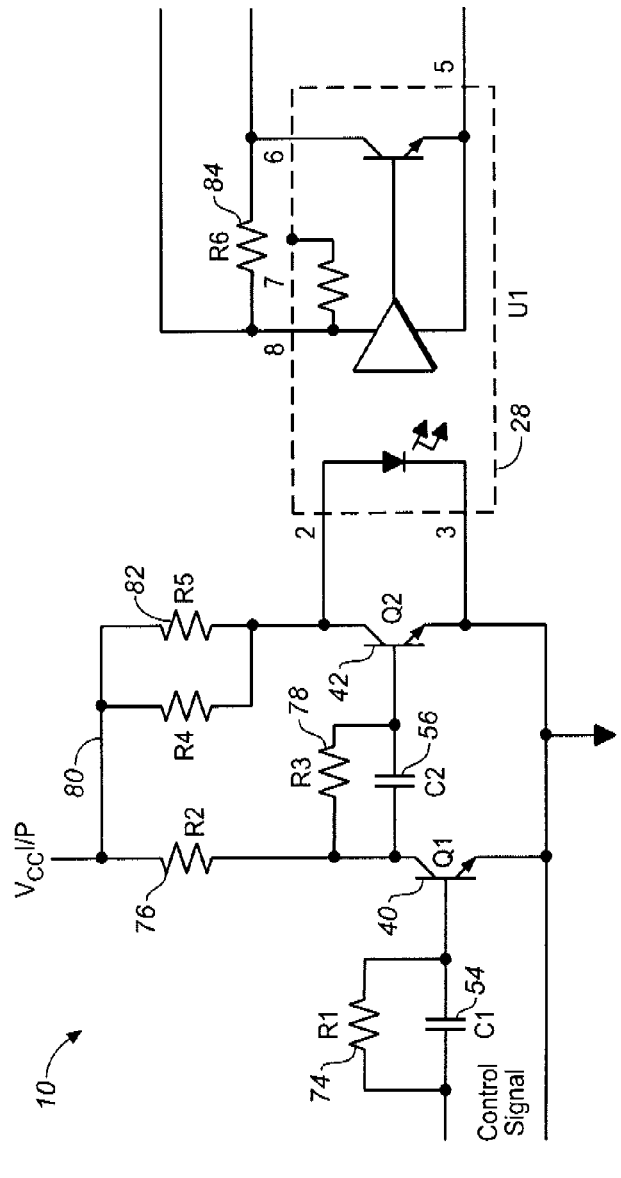
FIGS. 2A and 2B are schematic diagrams of an exemplary implementation for gate driver system with short circuit protection, according to an embodiment of the invention.
Figure 2B:
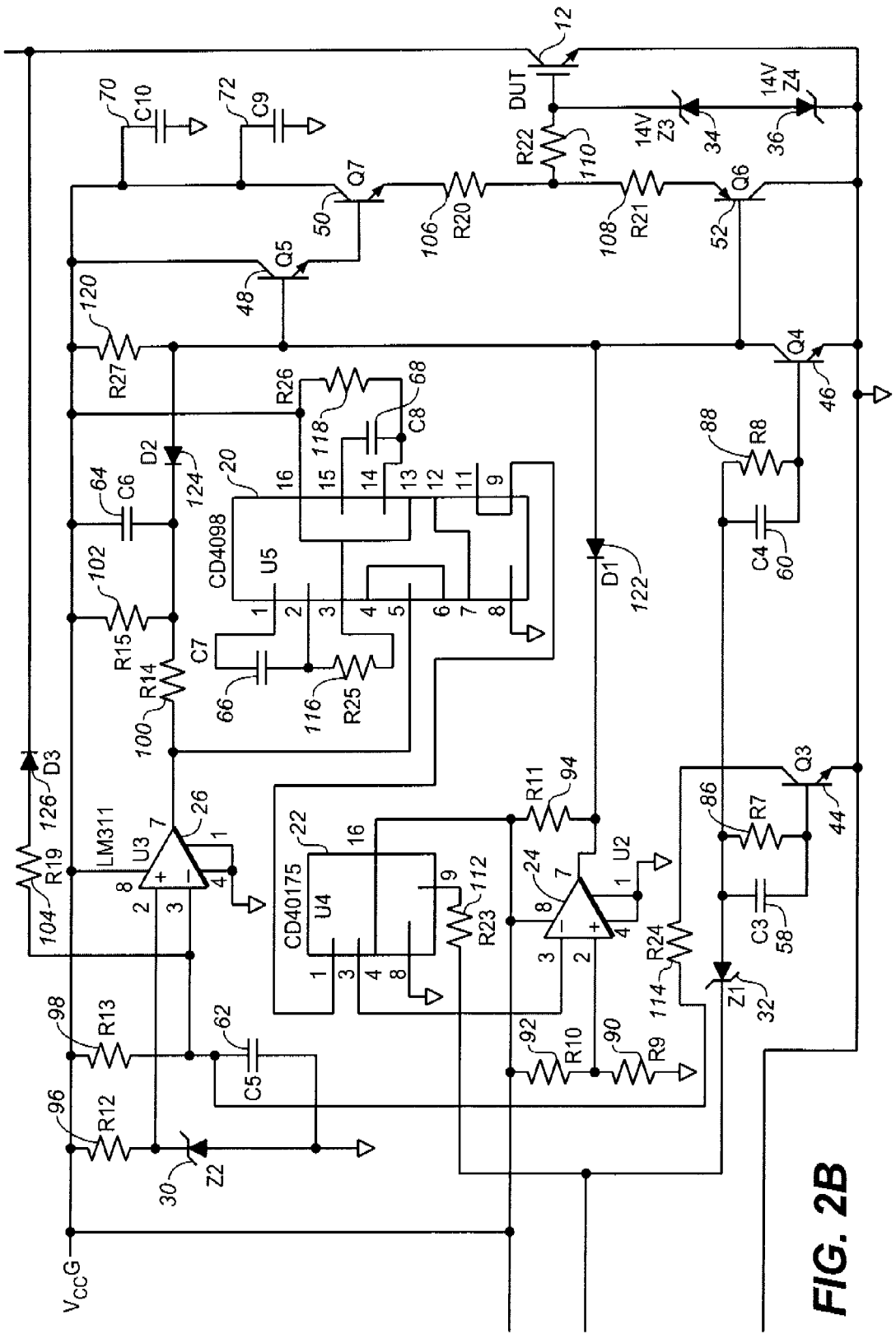

FIG. 2 is a schematic diagram of a gate driver system 10, according to an embodiment of the invention. Gate driver system 10 and switching device 12 may be employed or used in a power converter system, such as a motor drive or uninterruptible power supply (UPS). The gate driver system 10 drives a switching device 12 (e.g., IGBT or MOSFET). The gate driver system 10 converts a control signal (e.g., from a control block 8) to a power signal that can efficiently control the turn-on and turn-off of the switching device. The gate driver system 10 can be implemented in one or more integrated circuit (IC) or high-voltage IC (HVIC) devices for driving the gate or gates of one or more power switching devices 12.

In one embodiment, the gate driver system 10 employs or implements a de-saturation detection technique for identifying and protecting the switching device 12 (e.g., IGBT or MOSFET) against a short circuit or fault condition in. A de-saturation condition exists if the voltage across the terminals of the device 12 (e.g., collector to emitter in an IGBT) rises above a certain amount (e.g., 5 to 8 volts) while the control (e.g., gate to emitter) voltage is high. Such a de-saturation condition indicates that the current through the switching device 12 has exceeded its normal operating level—i.e., there is a short circuit somewhere in the system. The gate driver system 10 provides for two-step, soft turn-off of the switching device 12 under fault condition, such as short-circuit.

Generally speaking, any switching device has a characteristic short-circuit withstand time (SCWT). The SCWT is the maximum duration or length of time for which the switching device can remain turned on under short circuit condition without destroying or causing damage to the switching device. A gate drive circuit should be designed so that it reacts promptly to a short circuit condition and safely turns-off the switch within the respective SCWT rating. The industry standard for SCWT has been 10 microseconds.

In recent years, switching devices (such as IGBTs) have been designed with lower conduction and switching losses, which generally reduces SCWT. For example, IGBT technology utilizes shallow junctions to decrease switching and conduction losses, but at the same time increasing the transconductance (gm) of the IGBT. Since the magnitude of the short circuit current in an IGBT is directly proportional to its transconductance, a higher collector current results during a short-circuit condition. The large collector current and high bus voltage places the IGBT in a state of high instantaneous power dissipation that can only be sustained for a few microseconds.

Some previously developed designs for a gate drive circuit use a one-step turn off to protect a switching device (e.g., MOSFET or IGBT) in response to a fault current or short circuit. In a one-step turn off, the voltage at the control terminal of the switching device is abruptly transitioned from one level to another to cause the device to turn off. Although this protects the switching device from the high level of fault current, it causes significant stress on the device. As such, the switching device must be selected with appropriate values (e.g., short-circuit withstand time (SCWT)) so that the system does not fail. Over time, the effect of the stresses may build up, which can lead to failure.

Other previously developed designs for a gate drive circuit use a two-step turn-off where the voltage at the control terminal is abruptly transitioned from one level to another level that still keeps the switching device turned on. Thereafter, the voltage at the control terminal is allowed to slowly decrease so that the switching device turns off. Such previous designs require a second voltage source (typically negative) to produce the abrupt transition for the switching device from one turn-on voltage level to the other turn-on voltage level. This makes the implementation of such designs more complicated and expensive.

The gate driver system 10, according to an embodiment of the present invention, employs a two-step turn-off process for turning off the switching device 12 when a de-saturation condition is detected (which may indicate a short-circuit). In the two-step process according to embodiments of the invention, the voltage at the control terminal of the switching device 12 is brought from a high turn-on voltage level (e.g., 13V) to a lower turn-on voltage level—such as, for example, just above the threshold voltage of the switching device 12 (e.g., 8V)—in a controlled manner and without the use of a negative voltage source. The lower turn-on voltage significantly reduces the saturation current of the switching device 12, but does not turn off the device. The gate driver system 10 holds the voltage at the control terminal of the switching device 12 at the lower turn-on voltage for a short, finite duration (e.g., 0.2 to 0.3 microseconds). Thereafter, system 10 brings the control terminal voltage safely down to zero, thus turning-off the switching device 12 without stress. Thus, embodiments of the present invention reduce short circuit current stress.

Thus, the gate driver system 10 provides for more reliable turn-off of a switching device 12 under fault condition (e.g., short circuit) as compared to previous designs, which are more affected by noise.

Due to the two-step turn-off, embodiments of the present invention, such as gate driver system 10, allow the use of a switching device with a SCWT that is shorter than the industry standard 10 microseconds. For example, a switching device 12 with even 2 to 3 microseconds SCWT can safely be turned-off and protected. Thus, a switching device 12, used in conjunction with the two-step turn-off gate drive, safely turns off in low impedance over-current faults and shorted bus conditions where single-step gate drivers fail. Also, because system 10 does not require a negative voltage source like some previous designs, it is simpler and less costly to implement. Because a switching device with the industry standard 10 microsecond SCWT is not needed, switching device 12 can be selected, designed, or optimized for other parameters, such as reducing switching losses.

Furthermore, unlike some previously developed designs, the gate driver system 10 does not require a high-power shunt resistor for short current detection. Also, unlike some previous designs which provide for two-step turn-off of a switching device, the gate driver system according to an embodiment of the present invention only requires one gate drive bias voltage.

As shown, gate driver system 10 includes multivibrator circuitry 20, Quad D flip flop 22, comparators 24, 26, optocoupler 28, Zener diodes 30, 32, 34, 36, transistors 40, 42, 44, 46, 48, 50, 52, capacitors 54, 56, 58, 60, 62, 64, 66, 68, 70, 72, resistors 74, 76, 78, 80, 82, 84, 86, 88, 90, 92, 94, 96, 98, 100, 102, 104, 106, 108, 110, 112, 114, 116, 118, 120, and diodes 122, 124, 126. Gate driver system 10 may be coupled to or include a power source (VccG).

A combination of elements including comparator 26, resistors 96, 98, 104, diode 126, and capacitor 62, and Zener diode 30 may implement fault detection circuitry for detecting a fault condition (e.g., short circuit or overload). Resistor 104 and diode 126 are coupled in series between the collector of switching device 12 and the inverting (−) terminal of comparator 26. Capacitor 62 stores a charge at the inverting (−) terminal of comparator 26. Resistor 96 and Zener diode 30 are coupled in series between power source VccG and the non-inverting (+) terminal of comparator 26. A fault condition exists if the voltage level at the inverting (−) input terminal of comparator 26 is greater than that at the non-inverting (+) terminal.

Resistor 102 and capacitor 64 may implement time constant circuitry. This time constant circuitry helps or supports the controlled reduction of voltage at the control terminal of the switching device 12 when a fault condition (e.g., short circuit or overload) is detected. The time constant circuitry controls the rate of decline (i.e., slope) from the higher turn-on voltage level (e.g., VccG) to the lower turn-on voltage level (just above the gate threshold voltage Vth) in the event of a fault condition.

Multivibrator circuitry 20 helps to generate or determine a time $t_{LTO}$ for which the switching device 12 is kept at the lower turn-on voltage level (just above threshold voltage Vth) in the event of a fault condition. Multivibrator circuitry 20 can include one or more mono-stable multivibrator circuits. Each monostable multivibrator circuit generates a signal with two states (i.e., a square wave signal). One of the states is stable, but the other is not. A monostable multivibrator circuit will flip into the unstable state for a determined period, but will eventually return to the stable state. This circuit, also known as a one shot, is useful for creating a timing period of fixed duration in response to some external event. The output pulse widths of each monostable multivibrator circuit is set by a respective resistor-capacitor (RC) network (capacitors 66, 68, and resistors 116, 118) coupled to the multivibrator circuitry 20. As such, multivibrator circuitry 20, capacitors 66, 68, and resistors 116, 118 implement one or more oscillators which provide respective oscillation or timing signals for gate driver system 10. These oscillation signals are used for or support digital control in gate driver system 10.

Gate driver system 10 includes de-saturation circuitry for reducing the saturation current of the switching device 12 in the event of a fault condition. In one embodiment, the de-saturation circuitry may be implemented with combination of elements including Quad D flip flop 22, multivibrator circuitry 20, comparator 24, diodes 122, 124, 126, Zener diode 30, and other passive components associated with these devices. The de-saturation of switching device current can be accomplished by reducing the voltage at the control terminal of switching device 12 from a high-turn voltage level (e.g., 13V) to a lower turn-on voltage level—such as, for example, just above the threshold voltage of the switching device 12 (e.g., 8V). The de-saturation circuitry may also function to determine how long the voltage at control terminal of switching device 12 will be held at the lower turn-on voltage level before the switching device 12 is turned off.

Figure 3:
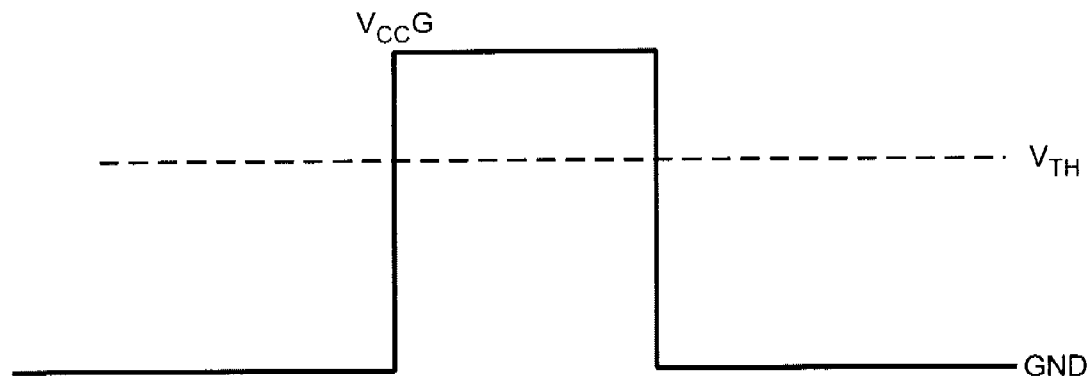
FIG. 3 is diagram of an exemplary waveform for the gate driver system in normal operation.

In operation, in one embodiment, as long as the fault detection circuitry has not detected any fault condition (e.g., short circuit or overload), gate driver system 10 drives switching device 12 normally. This is shown in FIG. 3, which is diagram of an exemplary waveform for the signal that gate driver system 10 applies to the control terminal of switching device 12 in normal operation. Referring to FIG. 3, the waveform in normal operation is a square wave signal with two voltage levels: high voltage level (VccG) (e.g., 13V) and low voltage level of ground (GND; e.g., 0V). The high voltage level VccG is above the gate threshold voltage (Vth) for the switching device 12 and, as such, turns on switching device 12. The low voltage level GND turns off switching device 12. As the gate driver system 10 alternately applies the two voltage levels to the control terminal of switching device 12 to turn it on and off, the motor drive or UPS (in which gate driver system 10 and switching device 12 may be incorporated) operates to provide power.

More specifically, referring again to FIG. 2, the gate driver system 10 will produce a positive signal with respect to the control terminal of the switching device 12 when the control signal (e.g., from the control block 8) goes high. As the control signal goes high, transistor 40 turns on, transistor 42 turns off, and the LED of optocoupler 28 turns on. This causes the output voltage of the optocoupler 28 to the low state. When the output of the optocoupler 28 goes low, both transistors 44 and 46 turn off, which causes the Darlington combination of transistors 48 and 50 to turn on. This will connect the VccG supply voltage to the control terminal of the switching device 12 through the gate turn-on resistor 110, thus initiating the turn-on process for switching device 12. During the time that transistor 46 is off, the output stage or buffer stage transistor 52 remains off. Once the switching device 12 is turned on, the inverting (−) input terminal of comparator 26 will be clamped to a voltage equal to the saturation voltage (Vcesat) of the switching device 12 plus one diode drop (i.e., forward voltage drop of de-saturation diode 126). For the gate driver system to operate properly (normal operation), the inverting (−) input terminal of comparator 26 should be at a lower voltage level than the non-inverting (+) terminal. In other words, for normal operation (no short-circuit or overload condition), comparator 26 remains off without effecting the gate driver system 10. Zener diode 30 sets the voltage for non-inverting input (+) terminal of comparator 26.

When the control signal goes low, the LED of optocoupler 28 turns off, and the output voltage of optocoupler 28 goes high. This turns on transistors 44 and 46. When transistor 44 turns on, capacitor 62 discharges through 114 allowing the output of the comparator 26 to remain high. Once transistor 46 is on, the output stage Darlington combination of transistors 48 and 50 turns off, and the PNP transistor 52 turns on. The voltage at the control terminal of the switching device 12 will discharge through resistors 110, 108 and transistor 52. This initiates the turn-off of the switching device 12 for normal operation.

Figure 4:
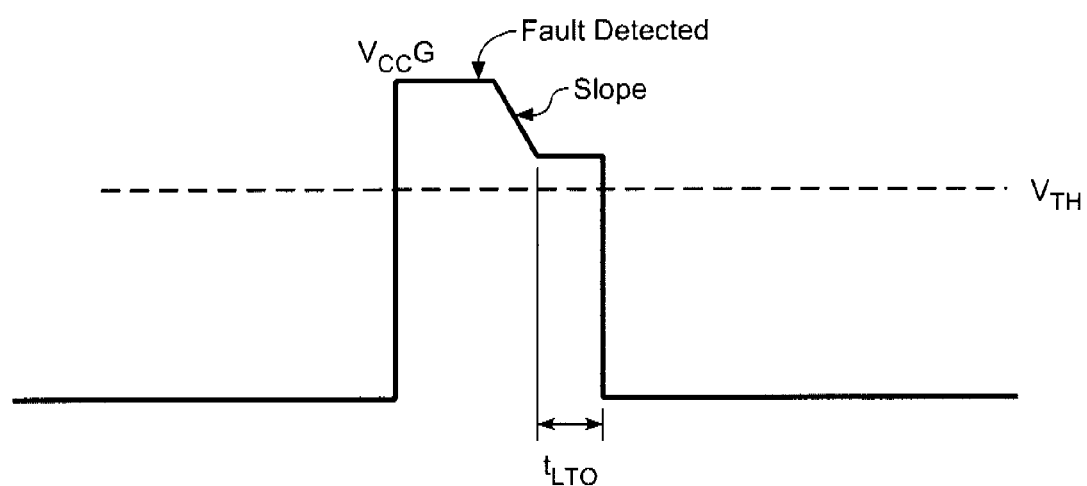
FIG. 4 is diagram of an exemplary waveform for the gate driver system under fault condition, according to an embodiment of the invention.

If, however, a fault (such as a short circuit) occurs in gate driver system 10, gate driver system 10 turns off switching device 12 using the two-step turn-off process described herein. This is shown in FIG. 4, which is diagram of an exemplary waveform for the gate driver system under fault condition, according to an embodiment of the invention. With reference to FIG. 4, when a fault is detected, gate driver circuit 10 brings the control terminal voltage of switching device 12 down from a high turn-on voltage level (VccG) to a lower turn-on voltage level (e.g., just above the threshold voltage of the switching device 12) in a controlled manner. The slope of the waveform for the drop in voltage between the high turn-on voltage level and the lower turn-on voltage level is controlled or set by the time constant circuitry (e.g., implemented with resistor 102 and capacitor 64) of gate driver system 10. Gate driver system 10 holds the voltage at the control terminal (gate) at the lower turn-on voltage for a short, finite duration, and then brings the control terminal voltage down to zero to safely turn off the switching device 12.

Referring again to FIG. 2, in particular, when a fault occurs (e.g., a short circuit at the output of inverter 6 or the complementary switching device 12 turns on due to noise), switching device 12 is turned-on into the low impedance load. Thus, switching device 12 draws a large current, which causes the collector to emitter voltage of the switching device 12 to rise towards the bus voltage. As the collector to emitter voltage of the device 12 rises, the voltage across capacitor 62 will begin to charge towards VccG. When the voltage across capacitor 62 rises above voltage of Zener diode 30, the comparator 26 turns-on. This activates the de-saturation circuitry of gate driver system 10.

The base voltage of Darlington transistor 48 decreases (e.g., to approximately 9 to 10V) at a relatively fast rate (slope of decline). Resistors 100, 102, 120, capacitor 64, and diode 124 set this voltage and slope (see FIG. 4). The voltage applied to the control terminal (gate) of the switching device 12 is reduced from the higher turn-on voltage level (e.g., 13V) to the lower turn-on voltage level just above Vth (e.g., 8V), significantly decreasing the saturation current of the switching device 12. The voltage across power device 12 will begin to increase when turn-on voltage starts to decrease. As soon as the gate bias reduces, electron current (MOSFET current) Ie reduces, as given by following equation:

$$Ie = \frac{\mu_{nx} C_{ox}}{2} \frac{Z}{L_c} (V_G - V_T)^2$$

As electron current reduces, base current of the switching device 12 is reduced. Thus, the gate driver system 10 reduces the saturation current of the switching device 12 under fault condition. The saturation current of IGBT is given by:

$$Ic(sat) = \frac{I_e}{(1 - \alpha_{pnp})}$$

The Quad D flip flop 22 and multivibrator circuitry 20 determine how long the voltage at the control terminal of the switching device 12 is kept at the lower turn-on voltage level (just above threshold voltage Vth). This time is shown in FIG. 4 as $t_{LTO}$. The time $t_{LTO}$ may be well-controlled and can be varied depending on the technology (e.g., IGBT) of the switching device 12. During $t_{LTO}$, the collector to emitter voltage across the switching device 12 rises faster than it would by holding the control terminal at 15V and the electron and hole current reduces to safe limits. During this time the short circuit current reduces to a safer limit, thereby reducing the turn-off stress of the switching device 12. The faster collector-to-emitter voltage rise is beneficial for the switching device 12 to safely turn-off under a shorted load.

After the time $t_{LTO}$, the comparator 24 turns on and the Darlington combination of transistors 48 and 50 turn-off. Transistor 52 turns on which causes the switching device 12 to safely turn off.

Thus, with embodiments of the present invention, gate voltage levels are well controlled during short circuit and over load conditions. Stated differently, when the switching device 12 is turned-on into an inductive short-circuit or it is under shoot-through condition, current through the switching device 12 ramps up quickly. The voltage across the switching device 12 increases and current through the device saturates if the gate voltage is kept on. Embodiments of the present invention, such as gate driver system 10, safely turn off the switching device 12 by employing a two-step turn-off which first de-saturates the current and thereafter brings the gate voltage is down to zero.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A power supply system comprising:
a switching device operable to be turned on and off for causing power to be delivered to a load, the switching device having a control terminal;
driver circuitry coupled to the control terminal of the switching device, the driver circuitry operable to drive the switching device, the driver circuitry further operable to:
 detect a fault condition in the power supply system;
 if the switching device is turned on when the fault condition is detected, reduce the voltage at the control terminal of the switching device to a level just above the threshold voltage for the switching device;
 hold the voltage at the control terminal to the level just above the threshold voltage for a controlled duration, thereby reducing the saturation current flowing through the switching device; and
 further reduce the voltage down to a low voltage level near ground at the control terminal of the switching device after the controlled duration, thereby safely turning off the switching device;
wherein the driver circuitry comprises a fault detection circuitry operable to detect the fault condition and a resistor-capacitor network coupled to the fault detection circuitry and to the switching device and operable if the fault condition is detected to control a rate of decrease of the voltage at the control terminal of the switching device from a high turn-on voltage level to the level just above the threshold voltage for the switching device.

2. The power supply system of claim 1 wherein the switching device comprises one of a metal-oxide-semiconductor field effect transistor (MOSFET), an insulated gate bipolar transistor (IGBT), or a bipolar junction transistors (BJT).

3. The power supply system of claim 1 wherein the fault condition comprises one of a short-circuit or over-current condition.

4. The power supply system of claim 1, wherein the fault detection circuitry comprises a capacitor, a Zener diode, and a comparator.

5. A system for protecting a switching device in a power supply system, the system comprising:
fault detection circuitry operable to detect a fault condition in the power supply system; and
de-saturation circuitry and time constant circuitry operable to safely turn-off the switching device if the switching device is turned on when the fault condition is detected, wherein:
 the de-saturation circuitry is operable to (i) reduce the voltage at the control terminal of the switching device from a high turn-on voltage level to a low turn-on voltage level, (ii) hold the voltage at the control terminal of the switching device at the low turn-on voltage level for a controlled duration, thereby reducing the saturation current in the switching device, and (iii) further reduce the voltage down to a low voltage level near ground at the control terminal of the switching device after the controlled duration, thereby safely turning off the switching device; and
 the time constant circuitry includes a resistor-capacitor network coupled to the fault detection circuitry and to the switching device and operable if the fault condition is detected to control a rate of decrease of the voltage at the control terminal of the switching device from the high turn-on voltage level to the low turn-on voltage.

6. The system of claim 5 wherein the low turn-on level is just above the threshold voltage for the switching device.

7. The system of claim 5 wherein the switching device comprises one of a metal-oxide-semiconductor field effect transistor (MOSFET), an insulated gate bipolar transistor (IGBT), or a bipolar junction transistors (BJT).

8. The system of claim 5 wherein the fault condition comprises one of a short-circuit or over-current condition.

9. The system of claim 5 wherein the fault detection circuitry comprises a capacitor, a Zener diode, and a comparator.

10. A method for protecting a switching device in a power supply system, the method comprising:
detecting a fault condition in the power supply system;
if the switching device is turned on when the fault condition is detected, reducing the voltage at a control terminal of the switching device to a level just above the threshold voltage for the switching device;
holding the voltage at the control terminal to the level just above the threshold voltage for a controlled duration, thereby reducing the saturation current flowing through the switching device; and
further reducing the voltage down to a low voltage level near ground at the control terminal of the switching device after the controlled duration, thereby safely turning off the switching device;
wherein the power supply system comprises fault detection circuitry operable to detect the fault condition and a resistor-capacitor network coupled to the fault detection circuitry and to the switching device, and wherein reducing the voltage at the control terminal of the switching device includes using the resistor-capacitor network if the fault condition is detected to control a rate of decrease of the voltage at the control terminal of the switching device from a high turn-on voltage level to the level just above the threshold voltage for the switching device.

11. The method of claim 10 wherein the switching device comprises one of a metal-oxide-semiconductor field effect transistor (MOSFET), an insulated gate bipolar transistor (IGBT), or a bipolar junction transistors (BJT).

12. The method of claim 10 wherein the fault condition comprises one of a short-circuit or over-current condition.

13. The method of claim 10, wherein the fault detection circuitry detects the fault condition using circuitry comprising a capacitor, a Zener diode, and a comparator.

* * * * *